(12) United States Patent
Manipatruni et al.

(10) Patent No.: US 10,263,036 B2
(45) Date of Patent: Apr. 16, 2019

(54) STRAIN ASSISTED SPIN TORQUE SWITCHING SPIN TRANSFER TORQUE MEMORY

(71) Applicant: Intel Corporation, Santa Clara, CA (US)

(72) Inventors: Sasikanth Manipatruni, Hillsboro, OR (US); Dmitri E. Nikonov, Beaverton, OR (US); Asif Khan, Berkeley, CA (US); Raseong Kim, Hillsboro, OR (US); Tahir Ghani, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/508,430

(22) PCT Filed: Sep. 25, 2014

(86) PCT No.: PCT/US2014/057356
§ 371 (c)(1),
(2) Date: Mar. 2, 2017

(87) PCT Pub. No.: WO2016/048317
PCT Pub. Date: Mar. 31, 2016

(65) Prior Publication Data
US 2017/0287979 A1 Oct. 5, 2017

(51) Int. Cl.
*H01L 29/82* (2006.01)
*H01L 27/22* (2006.01)
(Continued)

(52) U.S. Cl.
CPC .......... *H01L 27/228* (2013.01); *G11C 11/161* (2013.01); *G11C 11/1659* (2013.01);
(Continued)

(58) Field of Classification Search
CPC ....... H01L 27/228; H01L 43/08; H01L 27/10; H01L 43/10; H01L 41/20; G11C 11/161; G11C 11/1659
(Continued)

(56) References Cited

U.S. PATENT DOCUMENTS 7,230,308 B2 * 6/2007 Iwata ..................... B82Y 10/00
257/295
7,355,885 B2 * 4/2008 Fukuzumi ............... G11C 11/16
257/241
(Continued)

FOREIGN PATENT DOCUMENTS

TW 201017665 5/2010
WO 2013090937 6/2013

OTHER PUBLICATIONS

International Search Report & Written Opinion dated May 26, 2015 for PCT Patent Application No. PCT/US2014/057356.
(Continued)

*Primary Examiner* — Thinh T Nguyen
(74) *Attorney, Agent, or Firm* — Green, Howard & Mughal LLP

(57) ABSTRACT

Described is an apparatus which comprises: a magnetic tunneling junction (MTJ) having a free magnetic layer; a piezoelectric layer; and a conducting strain transfer layer coupled to the free magnetic layer and the piezoelectric layer. Described is a method, which comprises: exciting a piezoelectric layer with a voltage driven capacitive stimulus; and writing to a MTJ coupled to the piezoelectric layer via a strain assist layer. Described is also an apparatus which comprises: a transistor; a conductive strain transfer layer coupled to the transistor; and a MTJ device having a free magnetic layer coupled to the conductive strain transfer layer.

20 Claims, 11 Drawing Sheets

(51) Int. Cl.
*G11C 11/16* (2006.01)
*H01L 43/02* (2006.01)
*H01L 43/08* (2006.01)
*H01L 27/20* (2006.01)
*H01L 41/20* (2006.01)
*H01L 43/10* (2006.01)
*H01L 27/11507* (2017.01)
*H01L 27/11502* (2017.01)
*H01L 49/02* (2006.01)

(52) U.S. Cl.
CPC .......... *G11C 11/1675* (2013.01); *H01L 27/20* (2013.01); *H01L 41/20* (2013.01); *H01L 43/02* (2013.01); *H01L 43/08* (2013.01); *H01L 43/10* (2013.01); *H01L 27/11502* (2013.01); *H01L 27/11507* (2013.01); *H01L 28/55* (2013.01)

(58) Field of Classification Search
USPC ....... 257/421, 295, 43, 252, E21.066; 438/3, 438/48; 365/158, 171
See application file for complete search history.

(56) References Cited

U.S. PATENT DOCUMENTS

| | | | |
|---|---|---|---|
| 2005/0036361 A1* | 2/2005 | Fukuzumi | G11C 11/16 365/158 |
| 2006/0118842 A1* | 6/2006 | Iwata | B82Y 10/00 257/295 |
| 2006/0133137 A1 | 6/2006 | Shin et al. | |
| 2007/0109838 A1 | 5/2007 | Zheng et al. | |
| 2010/0080048 A1 | 4/2010 | Liu et al. | |
| 2012/0025339 A1 | 2/2012 | Zhu | |
| 2012/0106233 A1 | 5/2012 | Katti | |
| 2012/0267735 A1* | 10/2012 | Atulasimha | G11C 11/16 257/421 |
| 2013/0299880 A1* | 11/2013 | Du | H01L 29/66984 257/252 |
| 2014/0159121 A1 | 6/2014 | Fukami et al. | |
| 2014/0269035 A1 | 9/2014 | Manipatruni et al. | |

OTHER PUBLICATIONS

Biswas et al., "Acoustically Assisted Spin-Transfer-Torque Switching of Nanomagnets: An Energy-Efficient Hybrid Writing Scheme for Non-Volatile Memory", Applied Physics Letters, 2013, 4 pages.

Roy et al., "Energy-efficient Mixed Mode Switching of a Multiferroic Nanomagnet for Logic and Memory", Applied Physics Letters, 2010, 23 pages.

Extended European Search Report for European Patent Application No. 14902862.3, dated Jun. 15, 2018.

Asif, K. et al., "Voltage induced magnetostrictive switching of nanomagnets: Strain assisted strain transfer torque random access memory", Applied Physics Letters, AI P Publishing LLC, US, vol. 104, No. 26, Jul. 2, 2014, pp. 1-5, XP012187669.

Wu, T. et al., "Giant electric-field-induced reversible and permanent magnetization reorientation on magnetoelectric Ni/(011) heterostructure", Appl. Phys. Lett, 98, 012504 (2011).

Office Action & Search Report dated Dec. 7, 2018 for TW Patent Application No. 104127159. With English translation.

\* cited by examiner

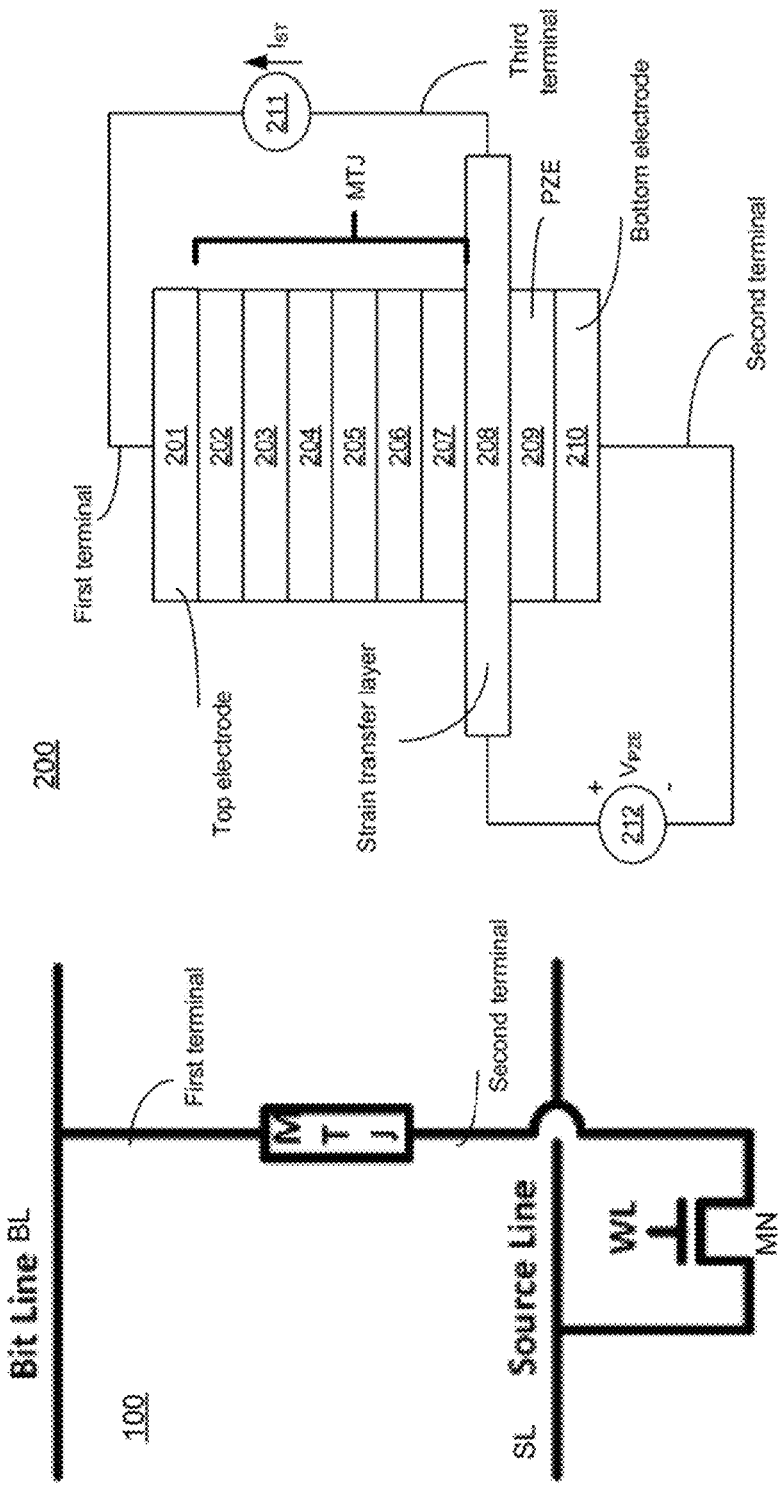

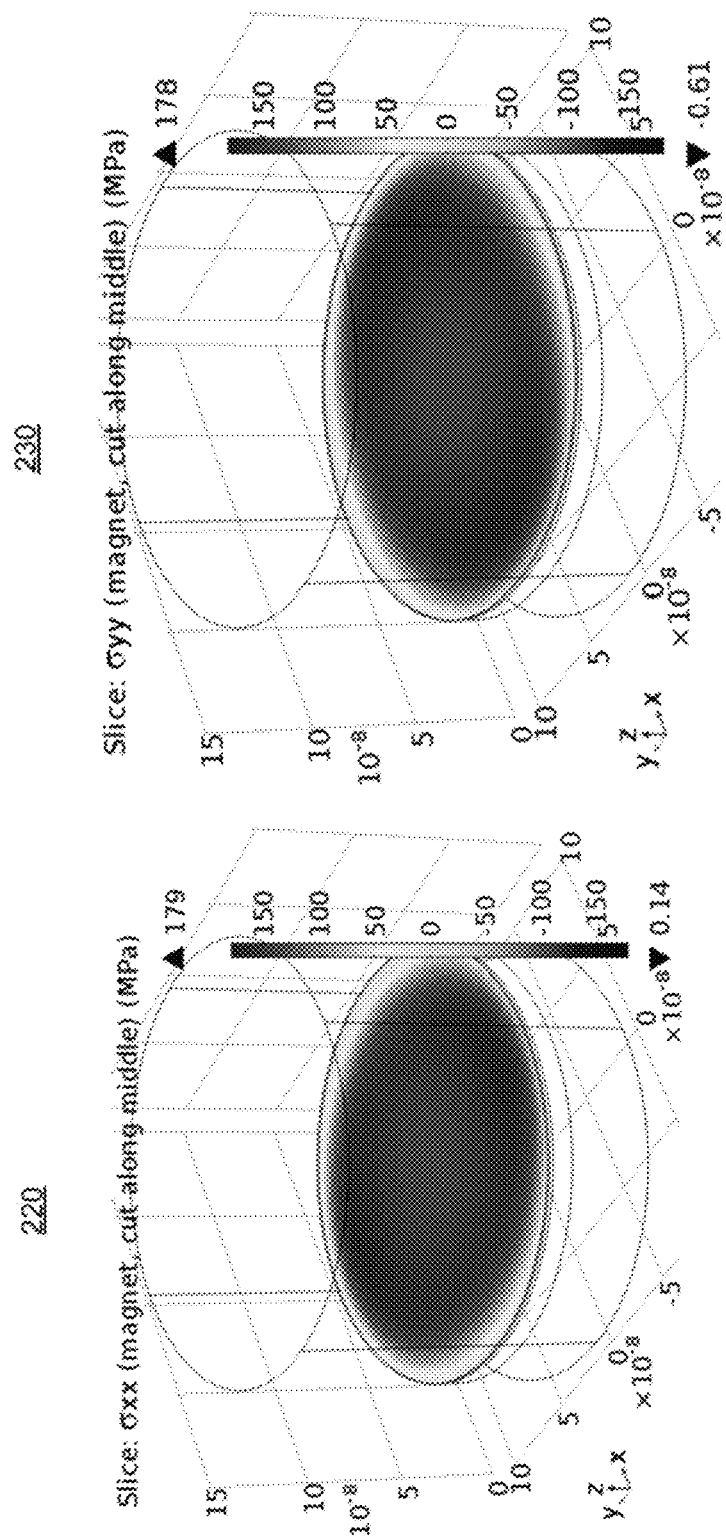

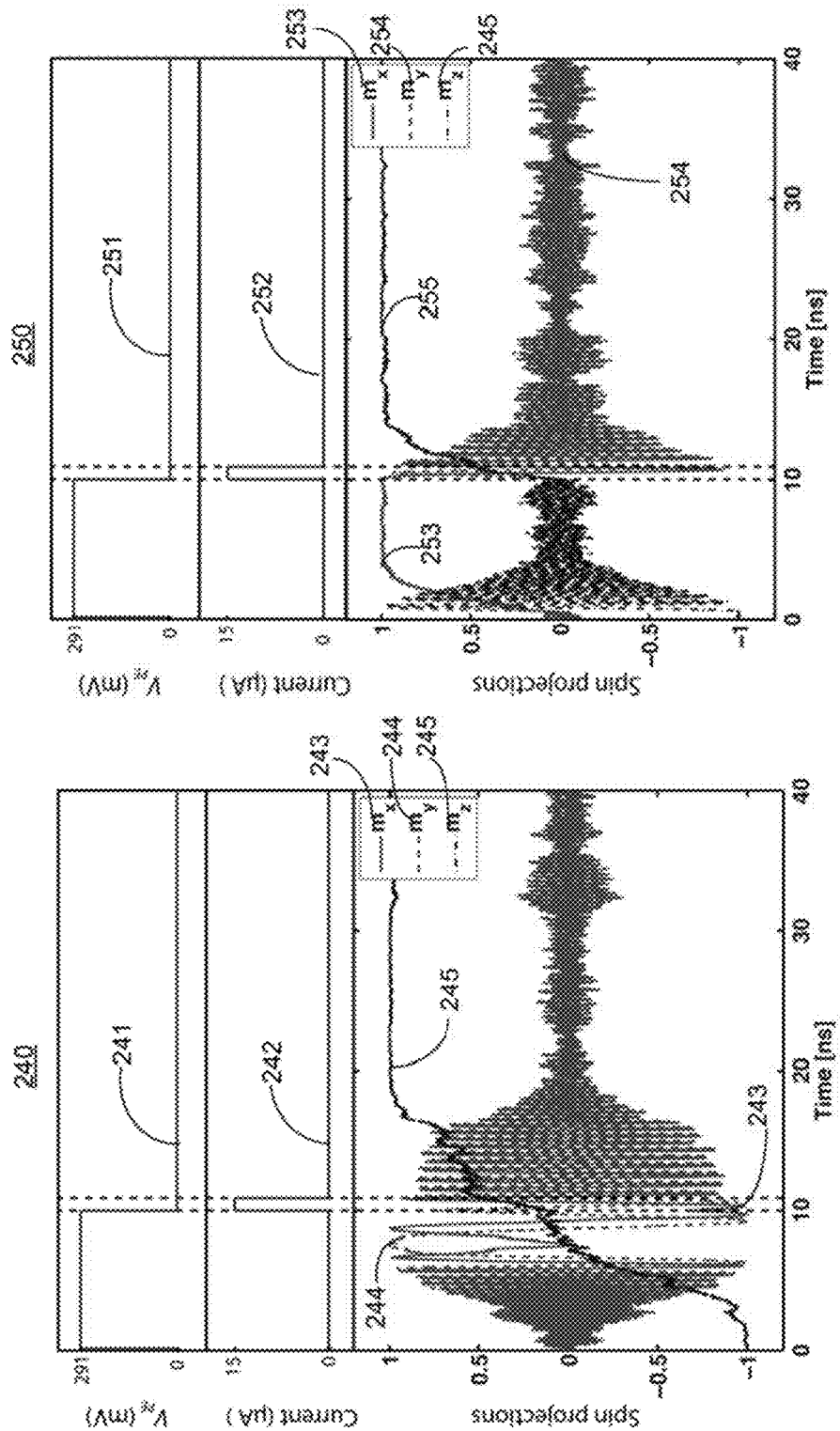

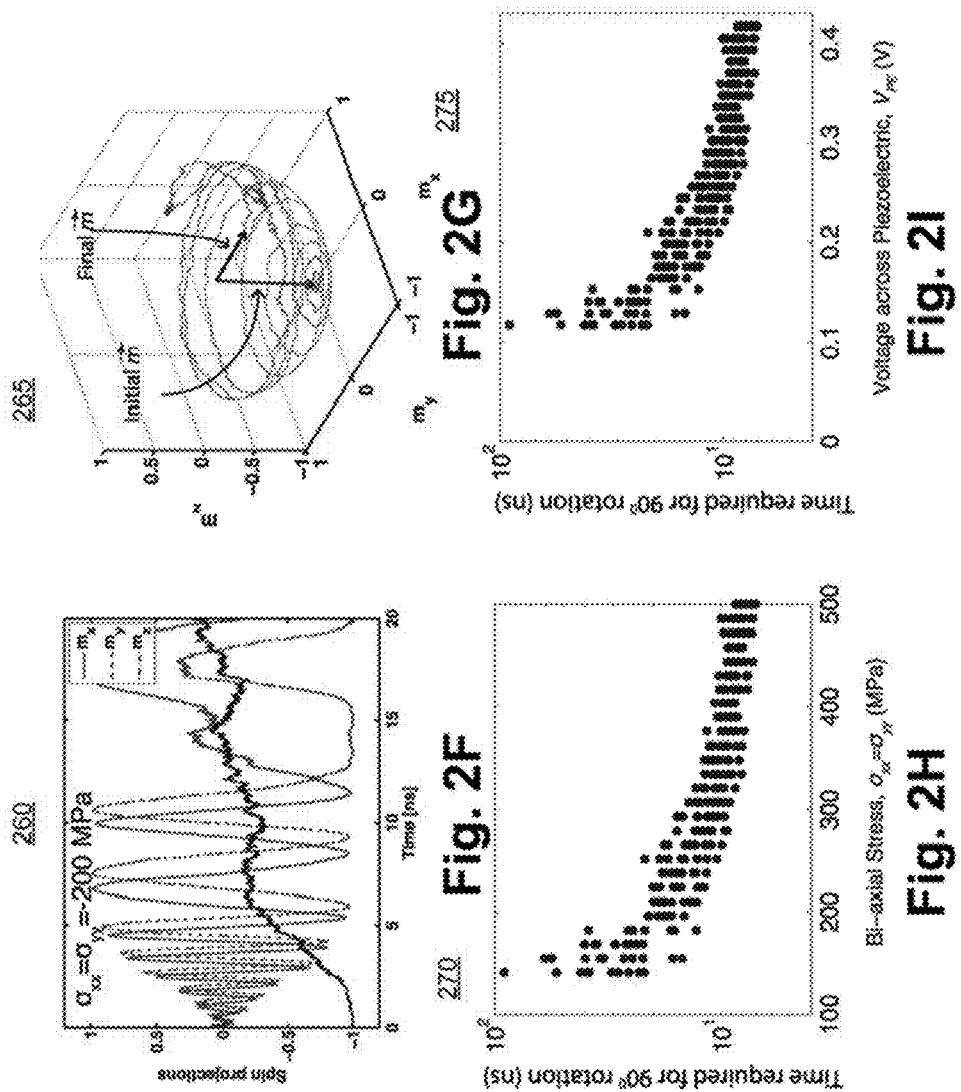

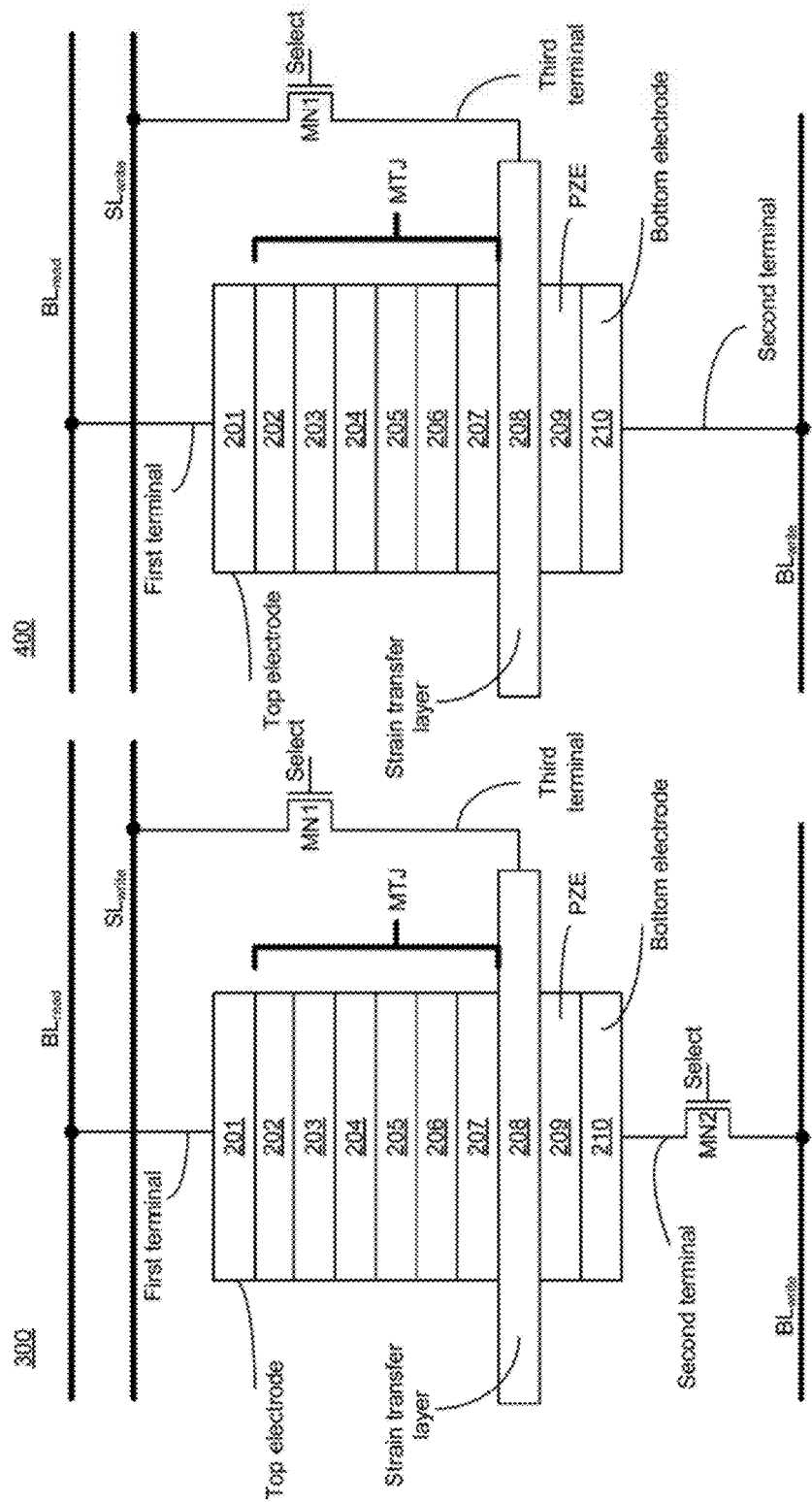

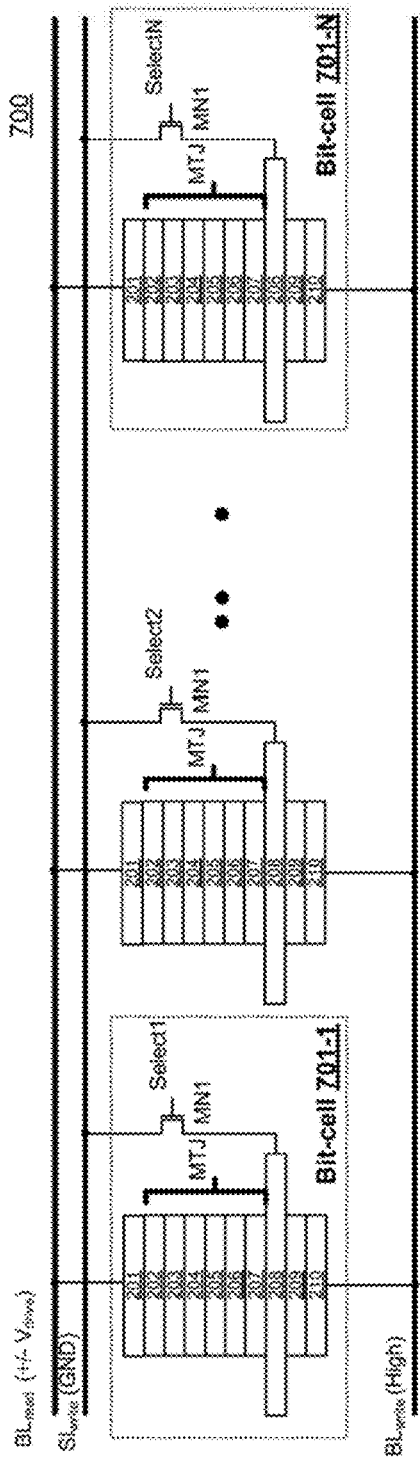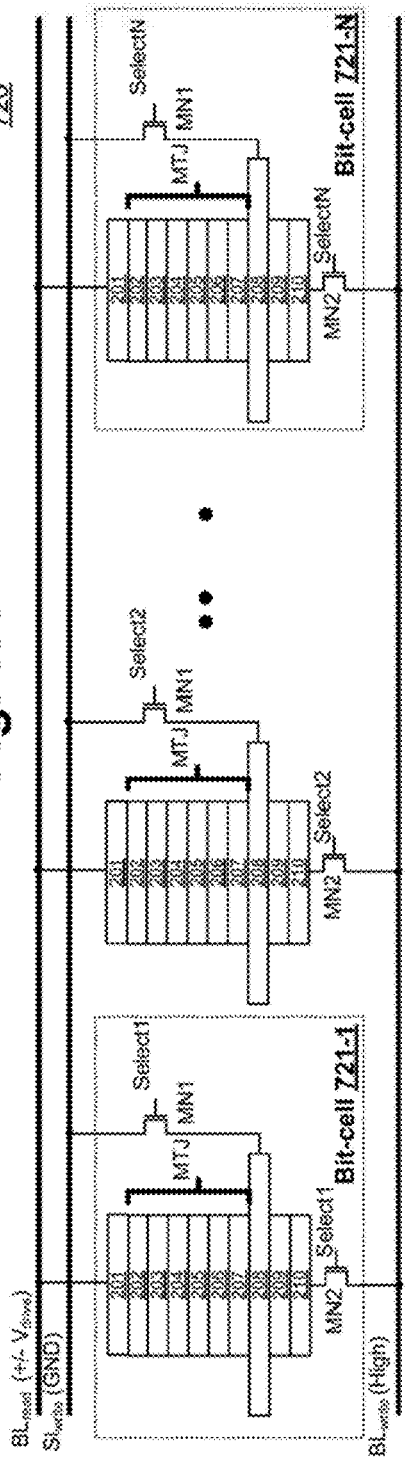
Fig. 7A
Fig. 7B

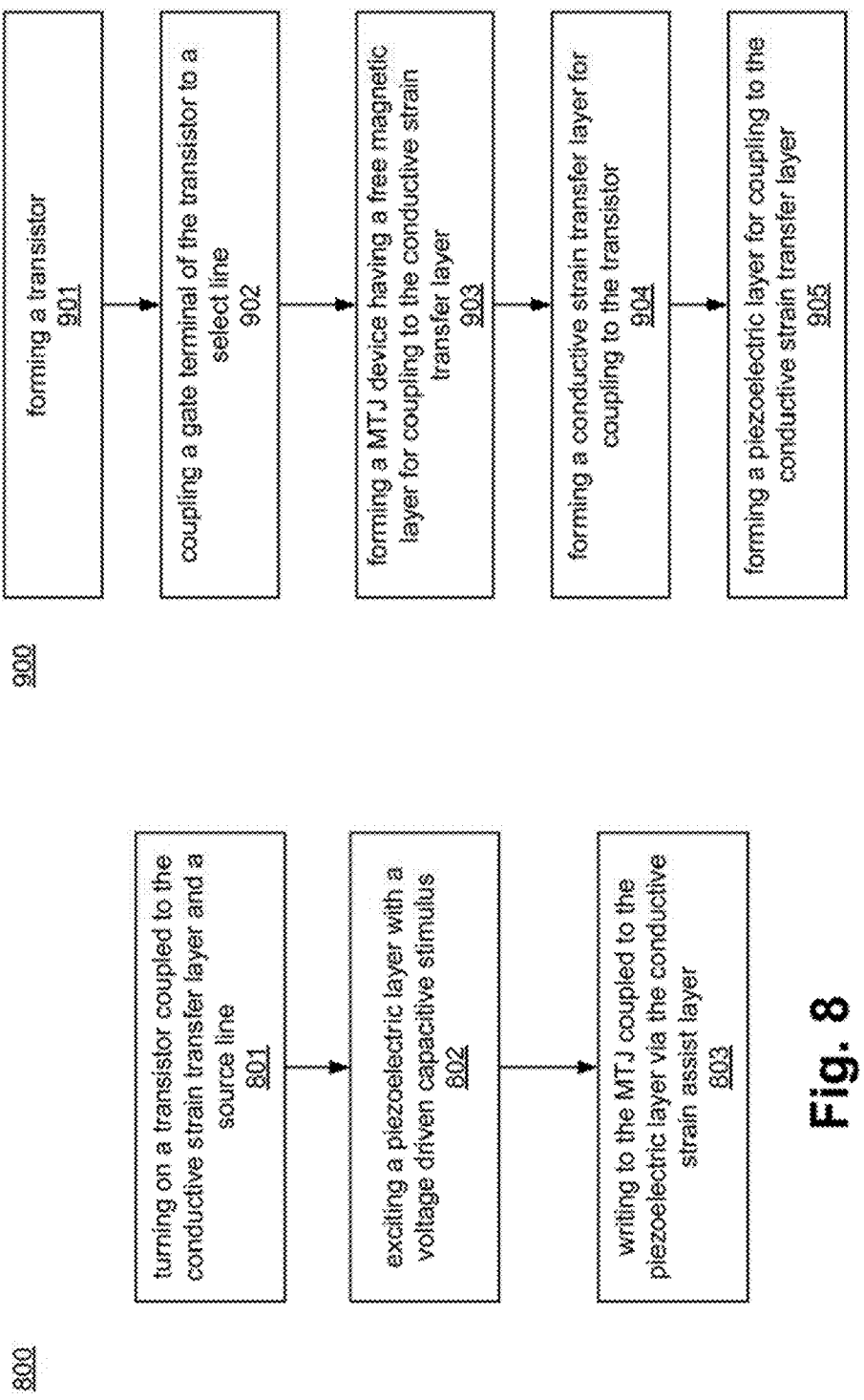

STRAIN ASSISTED SPIN TORQUE SWITCHING SPIN TRANSFER TORQUE MEMORY

CLAIM OF PRIORITY

This Application is a National Stage Entry of, and claims priority to, PCT Application No. PCT/US14/57356, filed on 25 Sep. 2014 and titled "STRAIN ASSISTED SPIN TORQUE SWITCHING SPIN TRANSFER TORQUE MEMORY," which is incorporated by reference in its entirety for all purposes.

BACKGROUND

On chip embedded memory with non-volatility can enable energy and computational efficiency. However, leading embedded memory options such as Spin-Transfer Torque Magnetic Random Access Memory (STT-MRAM) suffer from high voltage and high current-density problems during the programming (i.e., writing) of a bit-cell.

For example, large write current (e.g., greater than 100 µA) and voltage (e.g., greater than 0.7V) may be required for tunnel junction based Magnetic Tunnel Junction (MTJ) to perform a write operation in a MTJ based STT-MRAM bit-cell because write operation may require writing through tunnel oxides. Another problem with STT based bit-cells is that they suffer from reliability issues due to high tunneling current in MTJs. Also, the energy barrier (i.e., kT, where 'k' is the Boltzmann's constant, and 'T' is temperature) to overcome during switching is a fixed quantity leading to several unfavorable design tradeoffs.

For example, for fast STT based bit-cells, lower kT is desired. However, lowing kT may require more refresh operations on the STT bit-cells. Likewise, a higher kT improves magnet memory retention in STT bit-cell. However, higher kT slows the operations of STT based bit-cells.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1 illustrates a traditional one-transistor (IT) bit-cell for Spin Transfer Torque Magnetic Random Access Memory (STT-MRAM).

FIG. 2A illustrates a three terminal strain assisted STT device, according to some embodiments of the disclosure.

FIGS. 2B-C illustrate 3D (three dimensional) plots showing generation of stress in the free magnetic layer of the STT device in FIG. 2A, via piezoelectric (PZE) excitation and strain transfer via magnetization switching with strain assisted STT effect, according to some embodiments of the disclosure.

FIGS. 2D-E illustrate plots showing magnetization switching with strain assisted STT effect using uniform bi-axial excitation and non-uniform bi-axial excitation, according to some embodiments of the disclosure.

FIGS. 2F-I illustrate plots showing effects of uniform bi-axial stress, according to some embodiments of the disclosure.

FIG. 3 illustrates a three terminal 2T-PZ-MTJ bit-cell, according to some embodiments of the disclosure.

FIG. 4 illustrates a three terminal 1T-PZ-MTJ bit-cell, according to some embodiments of the disclosure.

FIG. 7A illustrates a row or column of an MRAM with three terminal 1T-PZ-MTJ bit-cells, according to some embodiments of the disclosure.

FIG. 7B illustrates a row or column of an MRAM with three terminal 2T-PZ-MTJ bit-cells, according to some embodiments of the disclosure.

FIG. 8 illustrates a flowchart of a method of operating the three terminal 1T or 2T-PZ-MTJ bit-cell, according to some embodiments of the disclosure.

FIG. 9 illustrates a flowchart of a method of forming the three terminal 1T or 2T-PZ-MTJ bit-cell, according to some embodiments of the disclosure.

DETAILED DESCRIPTION

Figure 2J:
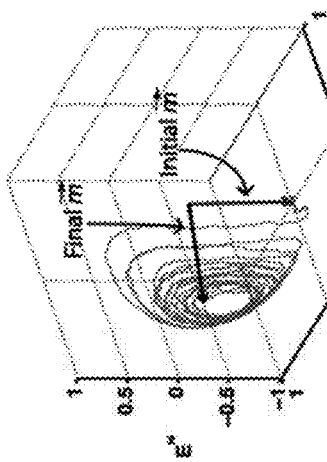
FIGS. 2J-M illustrate plots showing effects of non-uniform bi-axial stress, according to some embodiments of the disclosure.
Figure 2K:
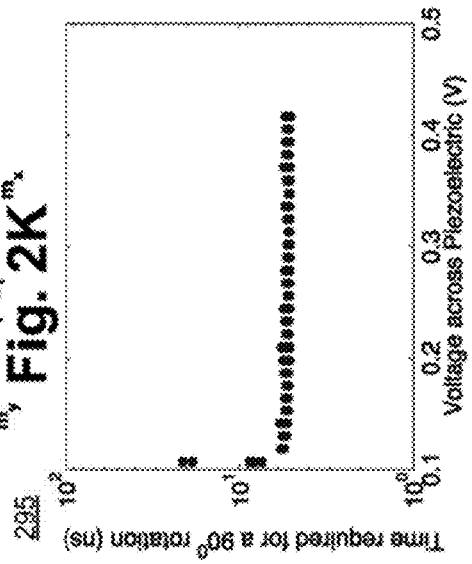
Figure 2L:
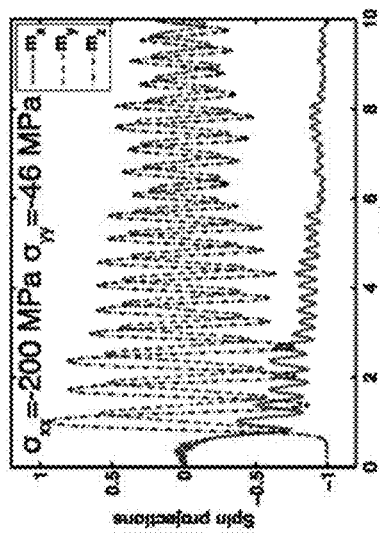
Figure 2M:
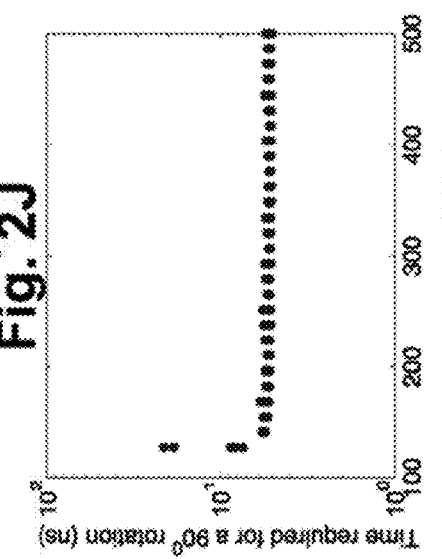

Several mechanisms for coupling between the electric field and the magnetic order in multiferroic magnetic-ferro/piezoelectric hetero-structures can be used. For example, charge modulation (such as, in Fe—$BaTiO_3$), exchange interactions (such as, in CoFeB—$BiFeO_3$), and magnetostriction (such as, in $La_{0.7}Sr_{0.3}MnO_3$/PMN-PT, CoFe—$BaTiO_3$, or FeRh—$BaTiO_3$). Logic and memory applications require a 180° reversal of the magnetization for operation. For the readout of the magnetic state, a MTJ is formed on top of the nanomagnets of the multiferroic hetero-structure. From a fabrication point of view, it is desirable to achieve the 180° switching by applying an out-plane electric field on the ferro/piezo-electric layer.

For magnetization reversal, the dynamics of magnetization rotation, which is governed by the non-linear Landau-Lifshitz-Gilbert (LLG) equation, requires a minimum current of certain spin polarization to flow through the nanomagnets. This minimum current dislodges the magnetization from its initial easy axis direction and rolls it over the energy barrier (i.e., kT) along the hard axis overcoming the Gilbert damping effect, thus, switching the direction of magnetization by 180° with respect to its initial direction.

The value of the critical current (that causes switching in the direction of magnetization) depends on the initial angle of the magnetization with respect to the easy axis $\theta_0$, which typically depends on the thermal fluctuations. If $\theta_0$ (<90°) is large, the critical current for magnetization reversal could be small. Hence, if the magnetization of the free magnetic layer in an STT-RAM is already rotated by an angle close to 90° by an external mechanism, then a spin polarized current significantly smaller than the critical current can switch the magnetization by another 90° leading to a complete magnetization reversal, thus, reducing the energy dissipation, according to some embodiments. Based on this, some embodiments describe a spintronic device combining magneto-strictive and STT based switching, where each of the two mechanisms provides a 90° switching of the magnetization leading to a complete 180° switching.

Some embodiments describe a spintronic device that reduces the switching drive current by lowering the effective switching barrier (i.e., kT) using a strain assisted mechanism. Some embodiments operate with strain assisted switching. In some embodiments, a voltage driven capacitive stimulus is applied to excite a piezoelectric layer (PZE) producing strain in the magnetic recording layer (i.e., the free magnetic layer of the MTJ). In some embodiments, strain coupled to the magnet produces a magneto-strictive switching of the magnet aligning the magnet to approx. 90° degrees from its steady state position. In some embodiments, a spin torque current with the appropriate polarity switches the device to 0° or 180° degrees based on the programming voltages. The spintronic device is also referred here as the strain assisted STT RAM.

In some embodiments, magneto-striction effect and the STT effect are combined to improve energy dissipation relative to a conventional STT-RAM. In some embodiments, magnetization switching in the spintronic device is caused by a piezoelectric-ferromagnetic hetero-structure via the combined magneto-striction. The STT effect can be simulated by solving the LLG equation incorporating the influence of thermal noise. The simulations show that, in various embodiments of the spintronic device, each of these two mechanisms (i.e., magneto-striction and STT) provides a 90° rotation of the magnetization leading a deterministic 180° switching with a critical current significantly smaller than that required for spin torque alone.

There are many technical effects of the embodiments. Some non-limiting technical effects are that a significantly smaller write current (e.g., less than 20 μA compared to 100 μA for nominal write operation) is used through the MTJ to write to the MTJ based bit-cell. The device of some embodiments improves reliability of the tunneling oxide in MTJ. The device of some embodiments improves switching energy since the transduction is capacitive with a current assist. Other technical effects will be evident from various embodiments described here.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors in various circuits and logic blocks are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices, MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates a traditional IT bit-cell for STT-MRAM. Here, the MTJ device is coupled in series to an n-type select transistor MN. The gate terminal of the n-type select transistor MN is coupled to word-line (WL). The source/drain terminal of the n-type transistor MN is coupled to source line (SL) and the drain/source terminal of the n-type transistor MN is coupled to one end of the MTJ. Another end of the MTJ is coupled to bit-line (BL).

The read and write current paths for bit-cell 100 are identical, resulting in many design trade-offs. For example, during read operation, higher resistance of MTJ device is desired than during write operation. However, the same current paths for passing read and write currents discourages from having different resistances for read and write operations. To write a logical high to bit-cell 100, BL is raised relative to SL, and to write a logical low to bit-cell 100, BL is lowered relative to the SL. To read from bit-cell 100, SL is set to logic low and MTJ resistance is sensed using weak current (e.g., $\frac{1}{8}^{th}$ of the write current).

The 1T-1MTJ bit-cell 100 may have large write current (e.g., greater than 100 μA) and large voltage (e.g., greater than 0.7V) requirements of tunnel junction. The 1T-1MTJ bit-cell 100 may have high write error rates or low speed switching (e.g., exceeding 20 ns) in MTJ based MRAM. The 1T-1MTJ bit-cell 100 may also have reliability issues due to tunneling current in magnetic tunnel junctions. For example, insulator layer in the MTJ device is a barrier (e.g., 1 KΩ to 10 KΩ) which resists flow of large current, and lower current flow causes higher write errors. The programming current for 1T-1MTJ bit-cell 100 is set by a fixed thermal stability barrier (i.e., kT) of the magnet (e.g., 40 kT-60 kT). High programming current (e.g., greater than 100 μA) combined with drive current limitations constrain the design of traditional 1T-1MTJ bit-cell 100.

FIG. 2A illustrates a three terminal (3T) strain assisted STT device 200, according to some embodiments of the disclosure. It is pointed out that those elements of FIG. 2A having the same reference numbers (or names) as the elements of any other figure can operate or function in any manner similar to that described, but are not limited to such.

In some embodiments, device 200 comprises First electrode 201 (also referred here as the Top electrode), MTJ (having layers 202 to 207), a conducting strain transfer layer 208, a piezoelectric layer (PZE) 209, Second electrode 210 (also referred here as the Bottom electrode); and a Third electrode. In some embodiments, MTJ comprises layers including: anti-ferromagnetic layer 202; fixed magnetic layer 203; exchange coupling layer 204; fixed magnetic layer 205; tunnel oxide 206; and free magnetic layer 207 with magneto-striction. In some embodiments, First electrode 201 is coupled to the First terminal, Bottom electrode 210 is coupled to the Second terminal, and strain transfer layer 208 is coupled to the Third terminal.

In some embodiments, a voltage drive capacitive stimulus 212 (i.e., $V_{PZE}$) is applied to excite PZE layer 209 producing strain in free magnetic layer 207 (also referred here as the magnetic recording layer) of the MTJ. In some embodiments, strain transfer layer 208, which is coupled to free magnetic layer 207, produces a magneto-strictive switching of free magnetic layer 207 to align it to approx. 90° from its steady state magnetic direction. In some embodiments, a spin torque current ($I_{ST}$) with appropriate polarity from source 211 is provided to switch the magnetic direction of free magnetic layer 207 to 0° or 180° based on the programming voltages.

In some embodiments, anti-ferromagnetic layer 202 is formed of IrMn and has a thickness in the range of 2 nm to 20 nm. In some embodiments, fixed magnetic layer 203 is formed of CoFe and has a thickness in the range of 1 nm to 20 nm. In some embodiments, exchange coupling layer 204 is formed of Ru and has a thickness in the range of 0.5 nm to 2 nm. In some embodiments, fixed magnetic layer 205 is formed of CoFeB and has thickness in the range of 1 nm to 20 nm. In some embodiments, tunnel oxide 206 is formed of MgO and has a thickness in the range of 1 nm to 3 nm. In some embodiments, free magnetic layer 207 with magneto-striction is formed of CoFeB, FeGa, MnGa, or Terfenol and has a thickness in the range of 2 nm to 5 nm. In other embodiments, other materials for the same groups or combinations of the groups in the periodic table may be used to form the layers of MTJ. In some embodiments, conducting strain transfer layer 208 is formed from one of W, Ta, Cu, Nb, or STO and has a thickness in the range of 3 nm to 60 nm. In some embodiments, strain transfer layer 209 is configured to allow strain transfer but be conductive less than 100 μOhm·cm. In some embodiments, the PZE layer 210 has a thickness in the range of 4 nm to 50 nm.

As mentioned here, magnetization reversal due to spin torque is governed by LLG equation. STT switching requires a critical spin torque current for switching, which processes the magnetization from its initial easy axis direction and rolls it over the energy barrier along the hard axis overcoming the Gilbert damping effect, thus, switching the direction of magnetization by 180° with respect to its initial direction. The value of the critical current depends on the effective magnetic barrier to be overcome by spin torque.

The STT structure described in the various embodiments of this disclosure lowers the effective magnetic barrier for spin torque switching by magneto-strictive pre-switching which switches the magnet at a much lower barrier for magnetic switching (i.e., it changes the hard axis into an easy axis, and the easy axis in to a hard one). In some embodiments, the strain assisted STT 200 lowers the switching current for spin torque switching using a voltage mediated magneto-strictive effect. By reducing the switching current through the MTJ, the energy per switching is reduced. The reduced switching current improves the reliability of the tunnel junction device.

In some embodiments, hybrid piezoelectric-ferromagnetic hetero-structure 200 is described in which a tetragonal mono-domain ferroelectric, Pb($Zr_{0.2}Ti_{0.8}$)$O_3$ (PZT) film is grown on a conducting Bottom electrode 210 coupled to PZE layer 209 on top of which nanomagnets (i.e., free magnetic layer 207) is lithographically patterned. The material parameters and the thickness of PZE layer 210 are listed in Table 1, according to some embodiments.

TABLE 1

Examples of material parameters and thickness of PZE layer 209

| Parameter | Value |
| --- | --- |
| Piezoelectric coefficient, $d_{31}$ | 180 pm/V |
| Piezoelectric coefficient, $d_{33}$ | 60 pm/V |
| Dielectric constant, $\varepsilon_r$ | 500 |
| Thickness, $d_{PE}$ | 30 nm |

In some embodiments, the application of voltage $V_{PZE}$ by source 212 between the nanomagnets via strain transfer layer 208 and Bottom electrode 210 generates an in-plane bi-axial strain in PZE layer 209, which is transferred to free magnetic layer 207 via strain transfer layer 208. For PZE layer 209 with (xyz=001) surface orientation (i.e., ferroelectric polarization along the ±z-axis), the bi-axial strain is equal in magnitude and sign along the in-plane crystallographic directions, (xyz=010) and (xyz=100). In some embodiments, the strain components along the (xyz=010) and (xyz=100) directions are given by $\varepsilon_{xx}=\varepsilon_{yy}=d_{31}E_z$, $d_{31}$ being the piezoelectric coefficient of PZE layer 209.

In some embodiments, for PZE layer 209 with (xyz=110) surface orientation, the application of an out-of-plane electric field creates two different strains along the two in-plane crystallographic directions, (xyz=001) and (xyz=101). In such embodiments, the strain components along the (xyz=001) and (xyz=101) directions are given by $\varepsilon_{xx}=(d_{31}+d_{33})E_z/2\sqrt{2}$ and $\varepsilon_{yy}=d_{31}E_z/\sqrt{2}$ respectively.

In some embodiments, in the presence of a bi-axial stress, the magnetic anisotropy of the nanomagnets changes due to the inverse magneto-striction effect. The energy contribution due to the stresses, $\{\sigma_i\}$, (i≡xx,yy) making angles, $\{\delta_i\}$ with the unit vector along the direction of the magnetization $\vec{m}$ is given by:

$$E_{strain} = 3/2 \lambda \Sigma_i \sigma_i \cos^2 \delta_i \quad (1)$$

where, $\lambda$ is the magneto-strictive coefficient of the magnetic material.

In some embodiments, $Co_{0.6}Fe_{0.4}$ is used as the material for nanomagnets (e.g., for free magnetic layer 207). $Co_{0.6}Fe_{0.4}$ exhibits a large magneto-strictive coefficient. Since $\lambda$ is positive for $Co_{0.6}Fe_{0.4}$, a tensile strain favors the alignment of the magnetization along the hard axis. Assuming the complete transfer of strain from PZE layer 209 to the nanomagnets of free magnetic layer 207, the stress and the strain in the nanomagnets of free magnetic layer 207 are related by $\sigma_i = Y \varepsilon_i$ (i≡xx,yy), Y being the Young's modulus of the magnetic material. The total energy of magnet with a perpendicular magnetic anisotropy, $H_k$ upon the application of a biaxial stress is given by $$E_{total} = E_{PMA} + E_{strain} = \frac{1}{2} \mu_0 M_s H_k \sin^2\theta + E_{strain} \quad (2)$$

where, $M_s$, $\mu_0$, and $\theta$ are the saturation magnetization of free magnetic layer 207, the vacuum permeability, and the angle of the magnetization with respect to the −z axis, respectively.

In some embodiments, the anisotropy field due to the stress is calculated using the following relation:

$$\vec{H_\alpha} = \frac{\partial E_{strain}}{\partial \vec{m}} \quad (3)$$

The dynamics of the nanomagnets of free magnetic layer 207 is described by the modified LLG equation, which is as follows:

$$\frac{\partial \vec{m}}{\partial t} = -\gamma \mu_0 [\vec{m} \times \vec{H_{eff}}] + \alpha \left[ \vec{m} \times \frac{\partial \vec{m}}{\partial \tau} \right] + \frac{\vec{I_p}}{eN_s} \quad (4)$$

where, $\gamma$ is the electron gyro-magnetic ratio, $\alpha$ is the Gilbert damping coefficient, $\vec{I_p}$ is the component of the vector spin current perpendicular to the magnetization, $\vec{m}$ entering the nanomagnets and $N_s$ is the total number of Bohr magnetons per magnet. $\vec{H_{eff}} = \vec{H_I} + \vec{H_{PMA}} + \vec{H_N}$ is the effective magnetic field and $\vec{H_{PMA}}$ and $\vec{H_N}$ are the fields due to perpendicular magnetic anisotropy and stochastic noise respectively. The noise field, $\vec{H_N} = H_i\hat{x} + H_j\hat{y} + H_k\hat{z}$ acts isotropically on the magnet and hence can be described as:

$$\langle H_l(t) \rangle = 0 \quad (5)$$

$$\langle H_l(t) H_k(t') \rangle = \frac{2\alpha k_B T}{\mu_0^2 \gamma M_s V} \delta(t-t') \delta_{lk} \quad (6)$$

where, $k_B$ is the Boltzmann constant, T is the temperature and V is the volume of the nanomagnets.

FIGS. 2B-C illustrate 3D plots 220 and 230 showing generation of stress in Free magnetic layer 207 of STT device 200 in FIG. 2A, via PZ excitation and strain transfer via magnetization switching with strain assisted STT effect, according to some embodiments of the disclosure. It is pointed out that those elements of FIGS. 2B-C having the same reference numbers (or names) as the elements of any other figure can operate or function in any manner similar to that described, but are not limited to such.

Plot 220 shows strain in the xx direction in the middle of free magnetic layer 207. Plot 230 shows strain in the yy direction in the middle of free magnetic layer 207 (i.e., the stress is across the center of the magnet layer about 1 nm away from the W interface in this example). Here, strain pattern of 100 MPa (Mega Pascal) of stress is formed in free magnetic layer 207 when 1.2V applied by source 212.

FIGS. 2D-E illustrate plots 240 and 250 showing magnetization switching with strain assisted STT effect using uniform bi-axial excitation and non-uniform bi-axial excitation, respectively, according to some embodiments of the disclosure. It is pointed out that those elements of FIGS. 2D-E having the same reference numbers (or names) as the elements of any other figure can operate or function in any manner similar to that described, but are not limited to such. Here, x-axis is time in ns and y-axis (from the top) shows applied voltage in mV, corresponding current in μA, and spin projections in x, y, and z directions (i.e., $m_x$, $m_y$, and $m_z$).

Plot 240 illustrates the case of uniform bi-axial strain. Plot 240 shows three subplots. The plot on the top is a voltage pulse 241. The plot in the middle is a current pulse 242, and the plot at the bottom having multiple waveforms (243, 244, and 245) illustrates spin projections. Here, projections of magnetization in the bottom plot shows the application of a uniform biaxial stress ($\sigma_{xx} = -350$ MPa and $\sigma_{yy} = -350$ MPa) upon application of a 15 μA current pulse for 1 ns.

In order to simulate combined strain-STT scheme for magnetization reversal, in some embodiments, a voltage (e.g., 291 mV as shown by waveform 241) is applied across the PZE layer 209 for a short duration (e.g., 10 ns), which creates a bi-axial strain of $\sigma_{xx} = \sigma_{yy} = \sigma = -350$ MPa. Afterwards, in some embodiments, a short current pulse is applied (e.g., 1 ns current pulse of 15 μA as shown by waveform 242). Waveform 241 shows the piezoelectric voltage, waveform 242 shows the current pulse sequence, and waveforms below it show the corresponding spin dynamics in x (i.e., $m_x$ waveform 243), y (i.e., $m_y$, 244), and z (i.e., $m_z$ waveform 245) directions. In this example, the magnetization of free magnetic layer 207 switches by 90° in approx. 5 ns upon the application of the strain pulse as shown by waveform 245. Upon the application of the current pulse 242, it takes another approx. 6 ns to completely switch magnetization in free magnetic layer 207 by 180° with respect to the initial direction.

Plot 250 shows a non-uniform biaxial strain. The plot on the top is a voltage pulse 251. The plot in the middle is a current pulse 252, and the plot at the bottom having multiple waveforms (243, 254, and 255) illustrates spin projections. Here, projections of magnetization in the bottom plot shows the application of a non-uniform bi-axial stress ($\sigma_{xx} = -350$ MPa and $\sigma_{yy} = -116$ MPa) followed by the application of a 15 μA current pulse for 1 ns. In both cases of plots 240 and 250, deterministic switching by 90° due to the strain followed by +/−90° due to the application of the +/−current in free magnetic layer 207 is shown.

In order to simulate combined strain-STT scheme for magnetization reversal, in some embodiments, a voltage (e.g., 291 mV as shown by waveform 251) is applied across PZE layer 209 for a short duration (e.g., 10 ns), which creates a non-uniform bi-axial strain $\sigma_{xx} = \sigma_{yy} = \sigma = -350$ MPa. Afterwards, in some embodiments, a short current pulse 252 is applied (e.g., 1 ns current pulse of 15 μA as shown by waveform 252). Waveform 251 shows the piezoelectric voltage, waveform 252 shows the current pulse sequence, and waveforms below it show the corresponding spin dynamics in x (i.e., $m_x$ waveform 253), y (i.e., $m_y$ 254), and z (i.e., $m_z$ waveform 255) directions. In this example, the magnetization in free magnetic layer 207 switches by 90° in approx. 3 ns upon the application of the strain pulse as shown by waveform 255. Upon the application of the current pulse 252, it takes another approx. 4 ns to completely switch magnetization in free magnetic layer 207 by 180° with respect to the initial direction.

FIGS. 2F-I illustrate plots 260, 265, 270, and 275 showing effects of uniform bi-axial stress, according to some embodiments of the disclosure. It is pointed out that those elements of FIGS. 2F-I having the same reference numbers (or names) as the elements of any other figure can operate or function in any manner similar to that described, but are not limited to such.

For plot 260, x-axis is time in us and y-axis is spin projections in x, y, and z directions (i.e., $m_x$, $m_y$, and $m_z$). For plot 265, x, y, and z axes are spin projections. For plot 270, x-axis is uniform bi-axial stress in MPa and y-axis is time in ns to achieve 90° rotation. For plot 275, x-axis is voltage across PZE layer 209 and y-axis is time in us to achieve 90° rotation.

In order for the initial conditions of the magnets to be randomized, the initial angle of the magnets follows the relationship:

$$\langle \theta^2 \rangle = \frac{k_B T}{M_s V \mu_0 H_{PMA}} \quad (7)$$

Here, the magnetization dynamics of the nanomagnets in the presence of a uniform bi-axial tensile stress $\sigma(=\sigma_{xx}=\sigma_{yy})$ is simulated. In order to understand the steady state condition of the magnet under the effect of the uniform bi-axial stress, Eq. 2 shows that without an applied stress (i.e., $\sigma=0$), the total energy is the minimum along ±z-axis ($\theta=0°$ and 180°). For a uniform bi-axial stress, $\sigma$, the stress energy can be written as $E_{strain}=3/2\lambda\sigma\cos^2\theta$. Hence, with the increase of the bi-axial tensile stress, the anisotropy energy along the ±z-axis increases and above a critical stress, $$\sigma_c = \frac{\mu_0 M_s H_k}{3\lambda}, \theta = 90°$$

(the xy-plane) becomes the minimum energy plane.

Assuming the continuity of strain at the interface between the nanomagnets of free magnetic layer 207 and the underlying PZE layer 209, the voltage required across the PZE layer 209 to generate the stress is given by $$V_{PE} = \frac{\sigma_c}{Y d_{31}} d_{PE},$$

where $d_{PE}$ is the thickness of PZE layer 209. The critical bi-axial stress, $\sigma_c$ for this system is calculated to be −132 MPa which corresponds to a voltage of 110 mV across PZE layer 209.

FIG. 2F and FIG. 2G show the dynamics of the magnetization upon the application of a uniform bi-axial stress, $\sigma=-200$ MPa which corresponds to a $V_{PE}=167$ mV. The initial direction of the magnetization is taken along the −z axis. Plot 260 shows that the time required for the 90° rotation of the magnetization in free magnetic layer 207 is approx. 10 ns and after 10 ns, the magnetization moves stochastically in the xy-plane. Plots 270 and 275 show the time required for the 90° rotation of the magnetization in free magnetic layer 207 as functions of $\sigma$ and $V_{PE}$, respectively.

FIGS. 2J-M illustrate plots 280, 285, 290, and 295 showing effects of non-uniform bi-axial stress, according to some embodiments of the disclosure. It is pointed out that those elements of FIGS. 2J-M having the same reference numbers (or names) as the elements of any other figure can operate or function in any manner similar to that described, but are not limited to such.

For plot 280, x-axis is time in ns and y-axis is spin projections in x, y, and z directions (i.e., $m_x$, $m_y$, and $m_z$). For plot 285, x, y, and z axes are spin projections. For plot 290, x-axis is non-uniform bi-axial stress in MPa and y-axis is time in ns to achieve 90° rotation. For plot 295, x-axis is voltage across PZE layer 209 and y-axis is time in ns to achieve 90° rotation.

In this case of non-uniform bi-axial strain, the magnetization dynamics is simulated with the stress energy given by Eq. (1) for $\sigma_{xx} \neq \sigma_{yy}$. For a non-uniform biaxial stress with $|\sigma_{xx}|>|\sigma_{yy}|$, it can be shown that, for $$\sigma_{xx} > \sigma_c = \frac{\mu_0 M_s H_k}{3\lambda},$$

±x-axis is the minimum energy direction along which the magnetization will rest at the steady state.

Plots 280 and 285 show the dynamics of the magnetization upon the application of 167 mV across PZE layer 209, which creates a non-uniform stress of $\sigma_{xx}=-200$ MPa and $\sigma_{yy}=-66$ MPa. Plot 285 shows that, at the steady state, the magnetization wiggles along the x-direction. This is in contrast with the case for uniform biaxial strain (i.e., plot 265 of FIG. 2G) where the steady state magnetization does not have any preferential direction in the xy-plane.

Plots 290 and 295 show the time required for the 90° rotation of the magnetization in free magnetic layer 207 as functions of $\sigma_{xx}$ and $V_{PE}$, respectively. Plot 296 shows that under non-uniform bi-axial stress, the time required for 90° rotation is significantly less than that for uniform bi-axial stress for a given $V_{PE}$.

It is interesting to note that once a bi-axial strain (uniform or non-uniform) has rotated the magnetization of free magnetic layer 207 by 90°, upon the removal of the stress, the magnetization has equal possibility to revert back to the original state and to switch by 180° with respect to the original state due to the effect of stochastic noise. Hence, magneto-striction effects alone may not deterministically switch the magnetization by 180°. However, in some embodiments, when a small spin current is injected through the magnet after the magnetization has rotated by 90°, it can deterministically switch the magnetization of free magnetic layer 207 by 180°.

For the nanomagnets considered in this example (see Table 2), the critical current is calculated to be 27 μA, for which the switching time is approx. 15 ns.

TABLE 2

Examples of material parameters of the nanomagnets
(e.g., free magnetic layer 207)

| Parameter | Value |
| --- | --- |
| Magnetization, $M_s$ | $8 \times 10^5$ A/m (1 Tesla/$\mu_0$) |
| Perpendicular anisotropy, $H_{PMA}$ | $8 \times 10^4$ A/m (0.1 Telsa/$\mu_0$) |
| Barrier height, $E_b$ | 40 $k_B T$ |
| Thickness, d | 1.2 nm |
| Width, a | 58 nm |
| Gilbert's coefficient, $\alpha$ | 0.027 |
| Magnetostriction coefficient, $\lambda$ | $+2 \times 10^{-4}$ [27] |
| Young's modulus, Y | $2 \times 10^{11}$ Pa |

There is a difference in energy dissipated in a conventional STT-RAM and a strain assisted STT-RAM. For the conventional STT-RAM, the energy dissipated is given by $E_{STT}=I^2 Rt_{current}$ (I=the magnitude of the charge current, R=the resistant of the tunnel junction and $t_{current}$=the duration of the spin current pulse) which equals $1.6 \times 10^7$ $k_B T$ for the simulated values I=27 µA, R=6 kΩ and $t_{current}$=15 ns. On the other hand, for the strain assisted STT-RAM scheme of some embodiments, the total energy dissipated with strain assisted switching is $E_{strain-STT}=E_{piezo}+E_{Reduced-BarrierSTT}$.

In some embodiments, the strain assisted STT-RAM leads to a shorter required current pulse $t_{current}$ as well as smaller switching current due to an angle deflection obtained by strain. The energy dissipated for generating the stress is $E_{piezo}=\frac{1}{2}CV^2$, where C is the capacitance of the piezoelectric capacitor given by $$\frac{\varepsilon_0 \varepsilon_T A}{d_{piezo}}.$$

For σ=−350 MPa, $E_{piezo}$ is calculated to be $5.1 \times 10^3$ $k_B T$. For strain assisted switching simulation results in I=15 µA and $t_{current}$=1 ns, $E_{Strain-STT}=3.3 \times 10^5$ $k_B T$. Here, the energy dissipation in a strain assisted STT-RAM of some embodiments is approx. 50 times smaller than its conventional counterpart.

FIG. 3 illustrates a three terminal 2T-PZ-MTJ bit-cell 300, according to some embodiments of the disclosure. It is pointed out that those elements of FIG. 3 having the same reference numbers (or names) as the elements of any other figure can operate or function in any manner similar to that described, but are not limited to such.

In some embodiments, 2T-PZ-MTJ bit-cell 300 comprises the stack of layers described with reference to FIG. 2A, and n-type transistors MN1 (also referred here as the first transistor) and MN2 (also referred here as the second transistor). In some embodiments, the First terminal is coupled to a first write bit-line ($BL_{write}$). In some embodiments, the Third terminal is coupled to the source/drain terminal of MN1. MN1 performs the function of 211 of FIG. 2A.

Referring back to FIG. 3, in some embodiments, the drain/source terminal of MN1 is coupled to a write Source Line ($SL_{write}$). In some embodiments, the Second terminal is coupled to the source/drain terminal of MN2. Referring back to FIG. 3, in some embodiments, the drain/source terminal of MN2 is coupled to a second $BL_{write}$. In some embodiments, the gate terminals of MN1 and MN2 are controlled by a Select signal provided on a Select line.

In some embodiments, when Select line is logic high, MN1 and MN2 turn on and apply a voltage stimulus (from the voltage between BLwrite and SLwrite) to excite PZE 209 which produces or induces a strain in free magnetic layer 207 via strain transfer layer 208. In some embodiments, the strain produces a magneto-strictive switching of the magnets in free magnetic layer 207 aligning those magnets to approx. 90° from their steady state positions. In some embodiments, the voltage potential between $SL_{write}$ and $BL_{read}$ is then used to apply a spin torque current to the MTJ with the appropriate polarity to switch magnetization of magnets in free magnetic layer 207 to 0° or 180° based on the polarity. A polarity of 0° or 180° of the magnets in free magnetic layer 207 may change the resistance of the MTJ to be high (AP state) or low (P state) or vise versa (depending on the magnetization polarity of fixed magnetic layer 205).

While the various embodiments of FIG. 3 are described with reference to n-type transistors, p-type transistors may also be used and the polarity of signals coupled to those transistors can be flipped. For example, the signal applied to STT switching MOSFET is reversed in polarity when n-type transistors are replaced with p-type transistors.

FIG. 4 illustrates a three terminal 1T-PZ-MTJ bit-cell 400, according to some embodiments of the disclosure. It is pointed out that those elements of FIG. 4 having the same reference numbers (or names) as the elements of any other figure can operate or function in any manner similar to that described, but are not limited to such. So as not to obscure the embodiments of FIG. 4, differences between FIG. 4 and FIG. 3 are described.

In some embodiments, MN2 of FIG. 4 is removed and replaced with a wire coupling $BL_{write}$ (second bit-line) to Bottom electrode 210. The operation of 1T-PZ-MTJ bit-cell 400 is similar to the operation of 2T-PZ-MTJ bit-cell 300. While the various embodiments of FIG. 4 are described with reference to n-type transistor, p-type transistor may also be used and the polarity of signals coupled to that transistor can be flipped.

Figure 5A:
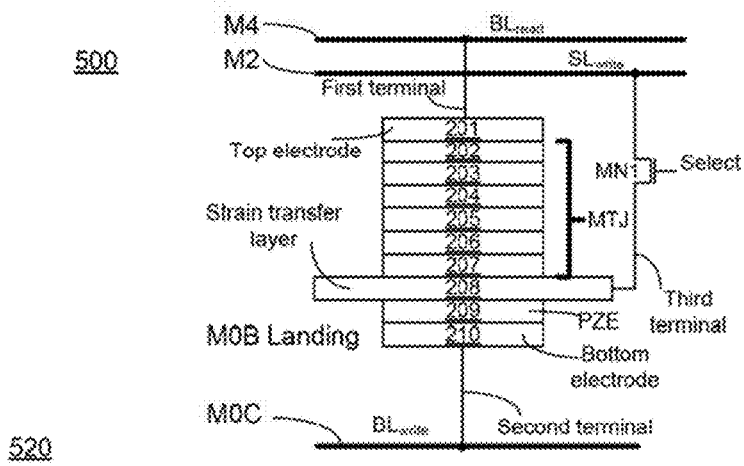
FIG. 5A illustrates a schematic of a three terminal 1T-PZ-MTJ bit-cell, according to some embodiments of the disclosure.

FIG. 5A illustrates a schematic 500 of a three terminal 1T-PZ-MTJ bit-cell, according to some embodiments of the disclosure. It is pointed out that those elements of FIG. 5A having the same reference numbers (or names) as the elements of any other figure can operate or function in any manner similar to that described, but are not limited to such.

The schematic 500 of 1T-PZ-MTJ bit-cell is similar to the schematic 1T-PZ-MTJ bit-cell 400 except that metal lines and location of the MTJ device relative to those lines are defined. In some embodiments, the first bit-line $BL_{read}$ is formed on the fourth metal line (M4) layer which is coupled through via(s) to Top electrode 201. In some embodiments, the second bit-line $BL_{write}$ is formed on the zero metal line (M0C) layer which is coupled through M0B landing to Bottom electrode 210. In some embodiments, Source line $SL_{write}$ is formed on the second metal line (M2) layer and is coupled to source/drain terminal of MN1.

Figure 5B:
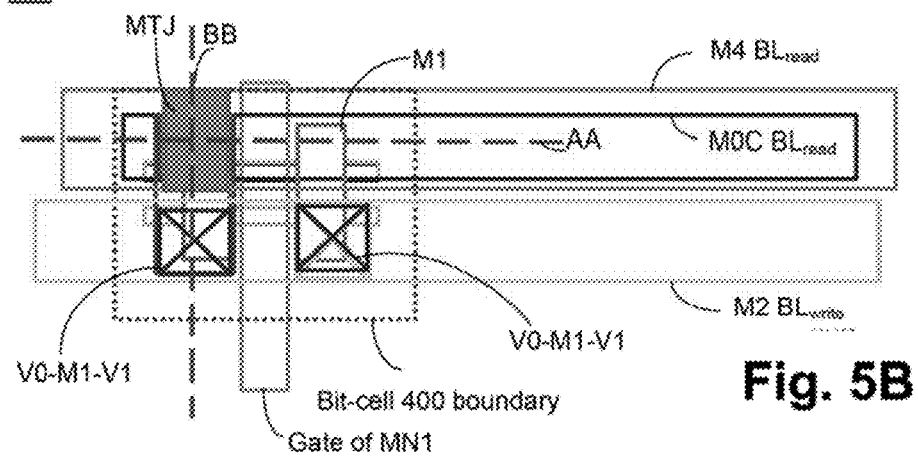
FIG. 5B illustrates a layout of the three terminal 1T-PZ-MTJ bit-cell of FIG. 5A, according to some embodiments of the disclosure.

FIG. 5B illustrates a layout 520 of three terminal 1T-PZ-MTJ bit-cell 500 of FIG. 5A, according to some embodiments of the disclosure. It is pointed out that those elements of FIG. 5B having the same reference numbers (or names) as the elements of any other figure can operate or function in any manner similar to that described, but are not limited to such.

Layout 520 illustrates a top view of 1T-PZ-MTJ bit-cell 500 and associated metal lines, contacts, and vias. An even numbered metal line layer extends in directions parallel to other even numbered metal lines, while an odd numbered metal line layer extends in directions parallel to other odd numbered metal lines layers. The dotted box shows the boundary of bit-cell 400 or 500. The dashed lines AA and BB are labels for cross-sections that are shown in FIG. 5C and FIG. 5D, respectively.

Referring back to FIG. 5B, in some embodiments, M2 SL$_{write}$ is coupled to the source/drain terminal of MN1, which is next to the Gate of MN1, through via zero (V0), first metal line (M1), and via V1. Here, via V1 directly couples to M2 SL$_{write}$. The shaded region shows the MTJ which is located in the region dedicated for the M2 layer, and vias V2 and V1. In some embodiments, the first bit-line BL$_{read}$ is coupled to the MTJ by via V2 and a section of the third metal line (M3) layer. In some embodiments, the second bit-line BL$_{write}$ is coupled to the MTJ via M0B landing (not shown) which is located below the MTJ.

Figures 5C, 5D:
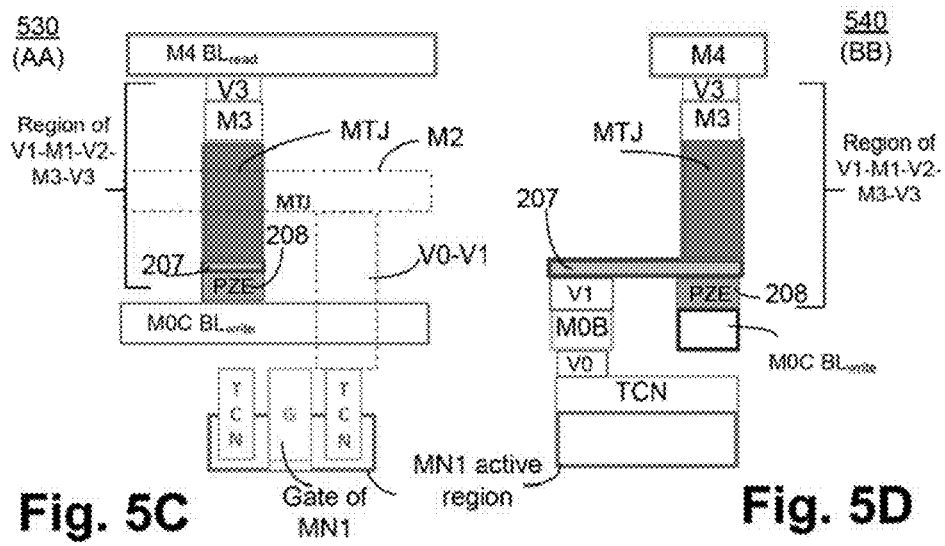
FIGS. 5C-D illustrate cross-sections of the layout of device of FIG. 5B, according to some embodiments of the disclosure.

FIGS. 5C-D illustrate cross-sections AA 530 and BB 540, respectively, of layout 520 of schematic 500, according to some embodiments of the disclosure. It is pointed out that those elements of FIGS. 5C-B having the same reference numbers (or names) as the elements of any other figure can operate or function in any manner similar to that described, but are not limited to such. Here, TCN forms the contacts for source/drain terminals of MN1.

Figure 6A:
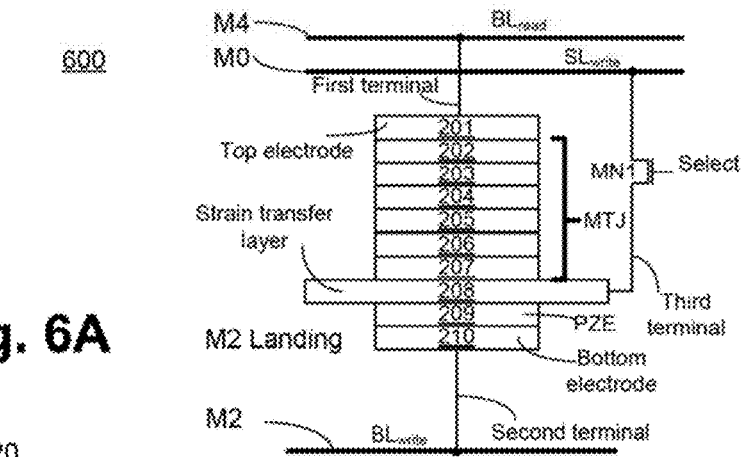
FIG. 6A illustrates a schematic of a three terminal 1T-PZ-MTJ bit-cell, according to some embodiments of the disclosure.

FIG. 6A illustrates a schematic 600 of a three terminal 1T-PZ-MTJ bit-cell, according to some embodiments of the disclosure. It is pointed out that those elements of FIG. 6A having the same reference numbers (or names) as the elements of any other figure can operate or function in any manner similar to that described, but are not limited to such.

The schematic 600 of 1T-PZ-MTJ bit-cell is similar to the schematic of 1T-PZ-MTJ bit-cell 400 except that metal lines and location of the MTJ device relative to those lines are defined, in some embodiments, the first bit-line BL$_{read}$ is formed on the M4 layer which is coupled through via V3 to Top electrode 201. In some embodiments, the second bit-line BL$_{write}$ is formed on the M2 layer which is coupled through M2 landing which is the Bottom electrode 210. In some embodiments, Source line SL$_{write}$ is formed on the M0 layer and is coupled to the source/drain terminal of MN1.

Figure 6B:
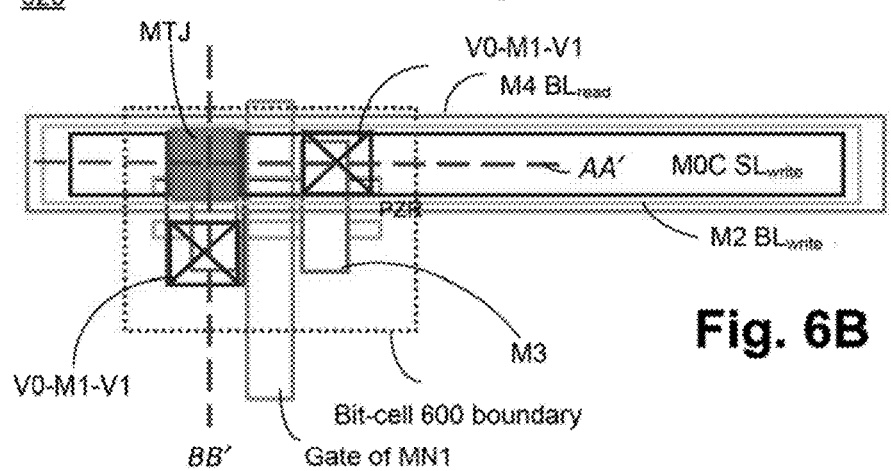
FIG. 6B illustrates a layout of the three terminal 1T-PZ-MTJ bit-cell of FIG. 6A, according to some embodiments of the disclosure.

FIG. 6B illustrates a layout 620 of the three terminal 1T-PZ-MTJ bit-cell of FIG. 6A, according to some embodiments of the disclosure. It is pointed out that those elements of FIG. 6B having the same reference numbers (or names) as the elements of any other figure can operate or function in any manner similar to that described, but are not limited to such.

Figure 6C:
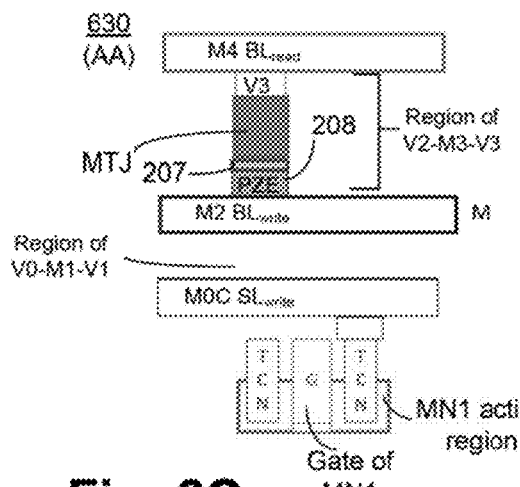
FIGS. 6C-D illustrate cross-sections of the layout of device of FIG. 6B, according to some embodiments of the disclosure.
Figure 6D:
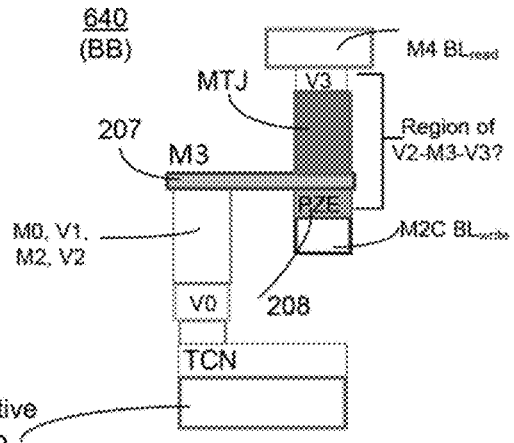

Layout 620 illustrates a top view of schematic 600 of 1T-PZ-MTJ bit-cell and associated metal lines, contacts, and vias. The dotted box shows the boundary of bit-cell 400 or schematic 600. The dashed lines AA and BB are labels for cross-sections that are shown in FIG. 6C and FIG. 6D, respectively. Referring back to FIG. 6B, in some embodiments. SL$_{write}$ in M0C layer is coupled to the source/drain terminal of MN1, which is next to the Gate of MN1, though M0B landing. The shaded region shows the MTJ which is located in the region dedicated for via V2, M3 layer, and via V3 (i.e., V2-M3-V3). In some embodiments, the first bit-line BL$_{read}$ in M4 layer is coupled to the MTJ by via V3 and a section of the M3 layer. In some embodiments, the second bit-line BL$_{write}$ on M2 layer is directly coupled to the MTJ. In this example, the pitch of layout 620 is 2M0×1.5Poly density.

FIGS. 6C-D illustrate cross-sections AA 630 and BB 640, respectively, of layout 620 of schematic 600, according to some embodiments of the disclosure. It is pointed out that those elements of FIGS. 6C-B having the same reference numbers (or names) as the elements of any other figure can operate or function in any manner similar to that described, but are not limited to such.

FIG. 7A illustrates a row or column 700 of an MRAM with three terminal 1T-PZ-MTJ bit-cells, according to some embodiments of the disclosure. It is pointed out that those elements of FIG. 7A having the same reference numbers (or names) as the elements of any other figure can operate or function in any manner similar to that described, but are not limited to such.

In some embodiments, row or column 700 comprises a plurality of bit-cells 701-1 to 701-N, where 'N' is an integer. In this example, bit-cells are 1T-PZ-MTJ bit-cells (e.g., bit-cell 400 with layouts of one of layout 520 or 620). Each transistor of the bit-cell is controlled by a corresponding, select signal. For example, MN1 transistor of bit-cell 701-1 is controllable by Select1 line having Select1 signal, MN1 transistor of bit-cell 701-7 is controllable by Select2 line having Select2 signal, and MN1 transistor of bit-cell 701-N is controllable by SelectN line having SelectN signal. In some embodiments, the unselected bit-cells in row or column 700 are not written since the un-selected transistor maintains an open terminal at the lateral contact and no switching current can flow through the unselected cells. In one example, the write voltage V$_{drive}$ is on the order of 30 mV to 80 mV.

FIG. 7B illustrates a row or column 720 of an MRAM with three terminal 2T-PZ-MTJ bit-cells, according to some embodiments of the disclosure. It is pointed out that those elements of FIG. 7B having the same reference numbers (or names) as the elements of any other figure can operate or function in any manner similar to that described, but are not limited to such.

In some embodiments, row or column 720 comprises a plurality of bit-cells 721-1 to 721-N, where 'N' is an integer. In this example, bit-cells are 2T-PZ-MTJ bit-cells (e.g., bit-cell 300). Each transistor of the bit-cell is controlled by a corresponding select signal. For example, MN1 and MN2 transistors of bit-cell 721-1 is controllable by Select1 line having Select1 signal, MN1 and MN2 transistors of bit-cell 721-2 is controllable by Select2 line having Select2 signal, and MN1 and MN2 transistors of bit-cell 721-N is controllable by SelectN line having SelectN signal. In some embodiments, the unselected bit-cells in row or column 720 are not written since the un-selected transistors maintain an open terminal at the lateral contact and no switching current can flow through the unselected cells. In some embodiments, MN1 provides a low voltage high current path while MN2 provides a high voltage low current path.

FIG. 8 illustrates a flowchart 800 of a method of operating the three terminal 1T or 2T-PZ-MTJ bit-cell, according to some embodiments of the disclosure. It is pointed out that those elements of FIG. 8 having the same reference numbers (or names) as the elements of any other figure can operate or function in any manner similar to that described, but are not limited to such.

Although the blocks in the flowchart with reference to FIG. 8 are shown in a particular order, the order of the actions can be modified. Thus, the illustrated embodiments can be performed in a different order, and some actions/blocks may be performed in parallel. Some of the blocks and/or operations listed in FIG. 8 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 803, the stored value in the bit-cell (e.g., 300, 400) is read by turning on the transistor(s) MN1 for bit-cell 400 (and MN2 for bit-cell 300). At block 802, PZE layer 209 of the bit-cell is excited by voltage driven capacitive stimulus via transistor MN2 or via the second bit-line $BL_{write}$. In some embodiments, the voltage driven piezoelectric capacitive stimulus produces a strain on free magnetic layer 207 of the MTJ. In some embodiments, the strain causes magnets in free magnetic layer 207 to produce a magneto-strictive switching of the magnets to align the magnets in free magnetic layer 207 to approximately 90° from their steady state positions.

At block 803, the first bit-line $BL_{read}$ is used to write a logic 0 or logic 1 to the MTJ via the conductive strain assist layer. In some embodiments, when a voltage is applied to the first bit-line $BL_{read}$ it causes a spin torque current with the appropriate plurality to switch the magnetization of free magnetic layer 207 of the MJT to 0° or 180° based on the applied voltage ($V_{drive}$).

FIG. 9 illustrates a flowchart 900 of a method of harming the three terminal 1T or 2T-PZ-MTJ bit-cell, according to some embodiments of the disclosure. It is pointed out that those elements of FIG. 9 having the same reference numbers (or names) as the elements of any other figure can operate or function in any manner similar to that described, but are not limited to such.

Although the blocks in the flowchart with reference to FIG. 9 are shown in a particular order, the order of the actions can be modified. Thus, the illustrated embodiments can be performed in a different order, and some actions/blocks may be performed in parallel. Some of the blocks and/or operations listed in FIG. 9 are optional in accordance with certain embodiments. The numbering of the blocks presented is for the sake of clarity and is not intended to prescribe an order of operations in which the various blocks must occur. Additionally, operations front the various flows may be utilized in a variety of combinations.

At block 901, transistor(s) (and MN2 for bit-cell 300) is formed in the active region. At block 902, gate terminal of transistor MN1 (and transistor MN2) is coupled to the Select line. At block 903, an NUT device and the other stacks (as shown in FIG. 2A) is formed in the region of V2-M3-V3 (as shown in FIGS. 6C-D), where V2 is coupled to Second electrode 210 and via V3 is coupled to First electrode 201. In some embodiments, an MTJ and the other stacks (as shown in FIG. 2A) is formed in the region of V1-M2-V2-M3-V3 (as shown in FIGS. 5C-D), where V1 is coupled to Second electrode 210 and via V3 is coupled to First electrode 201. At block 904, conductive strain transfer layer 208 is formed for coupling to transistor MN1 (for bit-cell 400). At block 905, PZE layer 209 is formed for coupling to conductive strain transfer layer 905.

Figure 10:
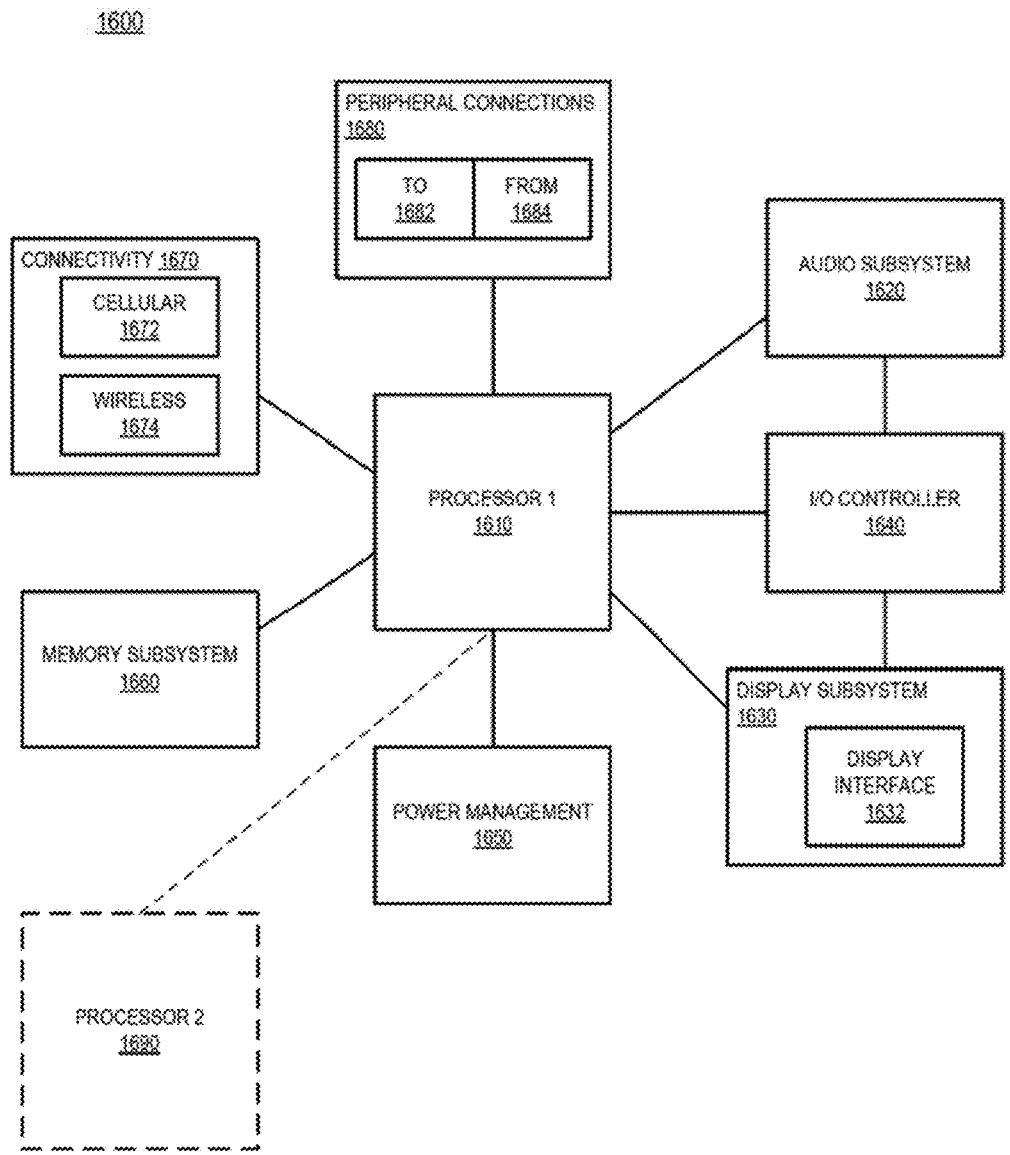
FIG. 10 illustrates a smart device or a computer system or a SoC (System-on-Chip) with the three terminal 1T or 2T-PZ-MTJ bit-cell, according to some embodiments.

FIG. 10 illustrates a smart device or a computer system or a SoC (System-on-Chip) with the three terminal 1T or 2T-PZ-MTJ bit-cell (e.g., 300 and 400), according to some embodiments. It is pointed out that those elements of FIG. 12 having the same reference numbers (or names) as the elements of any other figure can operate or function in any manner similar to that described, but are not limited to such.

FIG. 12 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes a first processor 1610 with the three terminal 1T or 2T-PZ-MTJ bit-cell (e.g., 300 and 400), according to some embodiments discussed. Other blocks of the computing device 1600 may also include the three terminal 1T or 2T-PZ-MTJ bit-cell (e.g., 300 and 400) of some embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and/or processor 1690) can include one or more physical devices, such as microprocessors, application processors, microcontrollers, programmable logic devices, or other processing means. The processing operations performed by, processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fail within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a MTJ having a free magnetic layer; a piezoelectric layer; and a conducting strain transfer layer coupled to the free magnetic layer and the piezoelectric layer. In some embodiments, the apparatus comprises: a first electrode coupled to the MTJ; a second electrode coupled to the conducting strain transfer layer; and a third electrode coupled to the piezoelectric layer. In some embodiments, the apparatus comprises: a first bit-line for coupling to the first electrode; a source line for coupling to the second electrode; and a second bit-line for coupling to the third electrode.

In some embodiments, the first bit-line is disposed on a fourth metal line layer, the second bit-line is disposed on the second metal line layer, and the source line is disposed on the zero metal line layer. In some embodiments, the MTJ is formed in a region dedicated for the second metal line layer. In some embodiments, the first bit-line is disposed on a fourth metal line layer, the second bit-line is disposed on the sixth metal line layer, and the source line is disposed on the second metal line layer. In some embodiments, the apparatus comprises: a first transistor coupled to the source line and the second electrode, the first transistor for coupling the source line to the second electrode according to a voltage potential of a select line. In some embodiments, the apparatus comprises: a second transistor coupled to the third electrode and the second bit-line, the second transistor for coupling the second bit-line to the third electrode according to a voltage potential of the select line.

In some embodiments, the apparatus comprises layers of: first electrode; anti-ferromagnetic layer; fixed magnet layer; exchange coupling layer; fixed magnet layer; tunnel oxide; free magnetic layer with magneto-striction; conducting strain transfer layer; piezoelectric layer; and second electrode. In some embodiments, the MTJ is formed with layers of: IrMn; CoFe; Ru; CoFeB; MgO; and CoFeB. In some embodiments, the conducting strain transfer layer is formed with one of: W, Ta, Cu, Nb, or STO, and wherein the free magnetic layer with magneto-striction is formed from one of: CoFeB, FeGa, MnGa, Terfenol. In some embodiments, the piezoelectric layer is a composite layer.

In another example, a system is provided which comprises: a processor; an MRAM coupled to the processor, the MRAM having a bit-cell according to the apparatus described above; and a wireless interface for allowing the processor to couple to another device.

In another example, an apparatus is provided which comprises: a transistor; a conductive strain transfer layer coupled to the transistor; and a MTJ device having a free magnetic layer coupled to the conductive strain transfer layer. In some embodiments, the transistor has a gate terminal coupled to a select line. In some embodiments, the apparatus comprises a piezoelectric layer coupled to the conductive strain transfer layer. In some embodiments, the apparatus comprises: a first electrode coupled to the MTJ; a second electrode coupled to the conductive strain transfer layer; and a third electrode coupled to the piezoelectric layer.

In some embodiments, the transistor is coupled to the second electrode, and wherein the transistor is operable to electrically couple the source line to the second electrode according to a voltage potential of the select line. In some embodiments, the apparatus comprises another transistor coupled to the third electrode and the select line. In some embodiments, the MTJ comprises layers of: first electrode; anti-ferromagnetic layer; fixed magnet layer; exchange coupling layer; fixed magnet layer; tunnel oxide; free magnetic layer with magneto-striction; conducting strain transfer layer; piezoelectric layer; and second electrode. In some embodiments, the MTJ is formed with layers of: IrMn; CoFe; Ru; CoFeB; MgO; and CoFeB. In some embodiments, the conductive strain transfer layer is formed with one of: W, Ta, Cu, Nb, or STO, and wherein the free magnetic layer with magneto-striction is formed from one of: CoFeB, FeGa, MnGa, or Terfenol.

In another example, a system is provided which comprises: a processor; an MRAM coupled to the processor, the MRAM having a bit-cell according to the apparatus described above; and a wireless interface for allowing the processor to couple to another device.

In another example, a method is provided which comprises: exciting a piezoelectric layer with a voltage driven capacitive stimulus; and writing to a magnetic tunneling junction (MTJ) coupled to the piezoelectric layer via a strain assist layer. In some embodiments, the method comprises turning on a transistor coupled to the conductive strain transfer layer and a source line. In some embodiments, coupling a first electrode coupled to the MTJ; coupling a second electrode coupled to the strain assist layer; and coupling a third electrode coupled to the piezoelectric layer. In some embodiments, the method comprises: coupling a first bit-line to the first electrode; coupling a source line to the second electrode; and coupling a second bit-line to the third electrode. In some embodiments, the MTJ is formed with layers of: CoFe; Ru; CoFeB; MgO; and CoFeB. In some embodiments, the strain assist layer is formed with one of: W, Ta, Cu, Nb, or STO, and wherein the free magnetic layer with magneto-striction is formed from one of: CoFeB, FeGa, MnGa, or Terfenol.

In another example, a method is provided which comprises; forming a transistor; forming a conductive strain transfer layer for coupling to the transistor; and forming a MTJ device having a free magnetic layer for coupling to the conductive strain transfer layer. In some embodiments, the method comprises coupling a gate terminal of the transistor to a select line. In some embodiments, the method comprises forming a piezoelectric layer for coupling to the conductive strain transfer layer.

In some embodiments, the method comprises: forming a first electrode for coupling to the MTJ; forming a second electrode for coupling to the conductive strain transfer layer; and forming a third electrode for coupling to the piezoelectric layer. In some embodiments, the method comprises: coupling the transistor to the second electrode, and wherein the transistor is operable to electrically couple the source line to the second electrode according to a voltage potential of the select line. In some embodiments, comprises coupling another transistor to the third electrode and the select line. In some embodiments, the method comprises: forming a first bit-line for coupling to the first electrode; forming a source line for coupling to the second electrode; and forming a second bit-line for coupling to the third electrode.

In some embodiments, the method comprises: disposing the first bit-line on a fourth metal line layer, disposing the second bit-line on the second metal line layer, and disposing the source line on the zero metal line layer. In some embodiments, the method comprises forming the MTJ in a region dedicated for the second metal line layer. In some embodiments, the method comprises: disposing the first bit-line on a fourth metal line layer, disposing the second bit-line on the sixth metal line layer, and disposing the source line on the second metal line layer.

In another example, an apparatus comprises: means for exciting a piezoelectric layer with a voltage driven capacitive stimulus; and means for writing to a MTJ coupled to the piezoelectric layer via a strain assist layer. In some embodiments, the apparatus comprises means for turning on a transistor coupled to the conductive strain transfer layer and a source line. In some embodiments, the apparatus comprises: means for coupling a first electrode coupled to the MTJ; means for coupling a second electrode coupled to the strain assist layer; and means for coupling a third electrode coupled to the piezoelectric layer. In some embodiments, the apparatus comprises: means for coupling a first bit-line to the first electrode; means for coupling a source line to the second electrode; and means for coupling a second bit-line to the third electrode. In some embodiments, the MTJ is formed with layers of: IrMn; CoFe; Ru; CoFeB; MgO; and CoFeB. In some embodiments, the strain assist layer is formed with one of: W, Ta, Cu, Nb, or STO, and wherein the free magnetic layer with magneto-striction is formed from one of: CoFeB, FeGa, MnGa, or Terfenol.

In another example, an apparatus is provided which comprises: means for forming a transistor; means for forming a conductive strain transfer layer for coupling to the transistor; and means for forming a MTJ device having a free magnetic layer for coupling to the conductive strain transfer layer. In some embodiments, the apparatus comprises means for coupling a gate terminal of the transistor to a select line. In some embodiments, the apparatus comprises means for forming a piezoelectric layer for coupling to the conductive strain transfer layer. In some embodiments, the apparatus comprises: means for forming a first electrode for coupling to the MTJ; means for forming a second electrode for coupling to the conductive strain transfer layer; and means for forming a third electrode for coupling to the piezoelectric layer. In some embodiments, the apparatus comprises: means for coupling the transistor to the second electrode, and wherein the transistor is operable to electrically couple the source line to the second electrode according to a voltage potential of the select line. In some embodiments, the apparatus comprises means for coupling another transistor to the third electrode and the select line.

In some embodiments, the apparatus comprises: means for forming a first bit-line for coupling to the first electrode; means for forming a source line for coupling to the second electrode; and means for forming a second bit-line for coupling to the third electrode. In some embodiments, the apparatus comprises: means for disposing the first bit-line on a fourth metal line layer, means for disposing the second bit-line on the second metal line layer, and means for disposing the source line on the zero metal line layer. In some embodiments, the apparatus comprises means for forming the MTJ in a region dedicated for the second metal line layer. In some embodiments, the apparatus comprises: means for disposing the first bit-line on a fourth metal line layer, means for disposing the second bit-line on the sixth metal line layer, and disposing the source line on the second metal line layer.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a magnetic junction including a free magnetic layer;
   a first layer comprising piezoelectric material; and
   a second layer with conductive strain transfer, wherein the second layer is coupled to the free magnetic layer and the piezoelectric layer, wherein the second layer includes one of: W, Cu, Nb, or STO ($StTiO_3$).

2. The apparatus of claim 1 comprises:
   a first electrode coupled to the magnetic junction;
   a second electrode coupled to the conductive strain transfer layer; and
   a third electrode coupled to the first layer.

3. The apparatus of claim 2 comprises:
   a first bit-line for coupling to the first electrode;
   a source line for coupling to the second electrode; and
   a second bit-line for coupling to the third electrode.

4. The apparatus of claim 3, wherein:
   the first bit-line is disposed on a fourth metal line layer,
   the second bit-line is disposed on the second metal line layer, and
   the source line is disposed on the zero metal line layer.

5. The apparatus of claim 4, wherein the magnetic junction is positioned in a region for the second metal line layer.

6. The apparatus of claim 3, wherein:
   the first bit-line is disposed on a fourth metal line layer,
   the second bit-line is disposed on the sixth metal line layer, and
   the source line is disposed on the second metal line layer.

7. The apparatus of claim 3 comprises:
   a first transistor coupled to the source line and the second electrode, wherein the first transistor is to couple the source line to the second electrode according to a voltage potential of a select line.

8. The apparatus of claim 7 comprises:
   a second transistor coupled to the third electrode and the second bit-line, wherein the second transistor is to couple the second bit-line to the third electrode according to a voltage potential of the select line.

9. The apparatus of claim 1, wherein the magnetic junction comprises layers including: IrMn; CoFe; Ru; CoFeB; MgO; and CoFeB.

10. The apparatus of claim 1, wherein the free magnetic layer with magneto-striction includes one of: CoFeB, FeGa, MnGa, or Terfenol.

11. The apparatus of claim 1, wherein the first layer is a composite layer.

12. An apparatus comprising:
    a transistor;
    a conductive strain transfer layer coupled to the transistor; and
    a Magnetic Tunnel Junction (MTJ) device having a free magnetic layer coupled to the conductive strain transfer layer, wherein the conductive strain transfer layer includes one of: W, Cu, Nb, or STO ($StTiO_3$).

13. The apparatus of claim 12, wherein the transistor has a gate terminal coupled to a select line.

14. The apparatus of claim 12, comprises
    a piezoelectric layer coupled to the conductive strain transfer layer.

15. The apparatus of claim 14 comprises:
a first electrode coupled to the MTJ;
a second electrode coupled to the conductive strain transfer layer; and
a third electrode coupled to the piezoelectric layer.

16. The apparatus of claim 15, wherein the transistor is coupled to the second electrode, and wherein the transistor is operable to electrically couple the source line to the second electrode according to a voltage potential of the select line.

17. The apparatus of claim 16 comprises another transistor coupled to the third electrode and the select line.

18. The apparatus of claim 12, wherein the MTJ comprises layers of:
an electrode; anti-ferromagnetic layer; fixed magnet layer; exchange coupling layer; fixed magnet layer; tunnel oxide; and free magnetic layer with magneto-striction.

19. The apparatus of claim 12, wherein the MTJ is formed with layers of: IrMn; CoFe; Ru; CoFeB; MgO; and CoFeB.

20. The apparatus of claim 12, wherein the free magnetic layer with magneto-striction is formed from one of: CoFeB, FeGa, MnGa, or Terfenol.

\* \* \* \* \*